(12) United States Patent
Hsu

(10) Patent No.: US 11,462,599 B2
(45) Date of Patent: Oct. 4, 2022

(54) DISPLAY PANEL WITH A THERMAL INSULATION LAYER, MANUFACTURING METHOD THEREOF, AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventor: Minghung Hsu, Beijing (CN)

(73) Assignees: HEFEI XINSHENG OPTOELECTRONICS TECHNOLOGY CO., LTD, Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 176 days.

(21) Appl. No.: 16/759,902

(22) PCT Filed: May 14, 2019

(86) PCT No.: PCT/CN2019/086853
§ 371 (c)(1),
(2) Date: Apr. 28, 2020

(87) PCT Pub. No.: WO2020/227928
PCT Pub. Date: Nov. 19, 2020

(65) Prior Publication Data
US 2021/0408180 A1 Dec. 30, 2021

(51) Int. Cl.
*H01L 29/08* (2006.01)
*H01L 27/32* (2006.01)
(Continued)

(52) U.S. Cl.
CPC ...... *H01L 27/3246* (2013.01); *H01L 51/5072* (2013.01); *H01L 51/5092* (2013.01);
(Continued)

(58) Field of Classification Search
CPC ............. H01L 27/3246; H01L 51/5072; H01L 51/5092; H01L 51/529; H01L 51/56; H01L 2227/323
(Continued)

(56) References Cited

U.S. PATENT DOCUMENTS 10,158,096 B2   12/2018   Lee et al.
2012/0217516 A1* 8/2012   Hatano ............... H01L 27/3246
                                                257/88

(Continued)

FOREIGN PATENT DOCUMENTS

CN    106575662 A    4/2017
CN    106910766 A    6/2017
(Continued)

OTHER PUBLICATIONS

International Search Report dated Feb. 6, 2020, issued in counterpart Application No. PCT/CN2019/086853. (11 pages).
(Continued)

*Primary Examiner* — Phuc T Dang
(74) *Attorney, Agent, or Firm* — WHDA, LLP

(57) ABSTRACT

A display panel may include a substrate (12), a bank layer (14) on the substrate (12), and a thermal insulation layer on the bank layer(14). The bank layer (14) defines a plurality of pixel areas (PA) on the substrate (12). The thermal insulation layer (20) may have a low thermal conductivity of about 0.01W/mk to about 0.5 W/mK. The thermal insulation layer (20) may be a porous thermal insulation layer.

20 Claims, 5 Drawing Sheets

(51) Int. Cl.
*H01L 51/50* (2006.01)
*H01L 51/52* (2006.01)
*H01L 51/56* (2006.01)

(52) U.S. Cl.
CPC ............ *H01L 51/529* (2013.01); *H01L 51/56* (2013.01); *H01L 2227/323* (2013.01)

(58) Field of Classification Search
USPC .......................................................... 257/40
See application file for complete search history.

(56) References Cited

U.S. PATENT DOCUMENTS

2017/0110681 A1* 4/2017 Shen ...................... H01L 51/524
2018/0016442 A1* 1/2018 Kim ..................... C23C 18/1295
2018/0294323 A1 10/2018 Yang et al.

FOREIGN PATENT DOCUMENTS

| | | |
|---|---|---|
| CN | 106953026 A | 7/2017 |
| CN | 108666436 A | 10/2018 |
| CN | 109638051 A | 4/2019 |
| JP | 2006216269 A | 8/2006 |
| JP | 2006244847 A | 9/2006 |
| JP | 2007213999 A | 8/2007 |

OTHER PUBLICATIONS

Office Action dated Mar. 22, 2022, issued in counterpart to CN Application No. 201980000638.6, with English Translation. (22 pages).

\* cited by examiner

DISPLAY PANEL WITH A THERMAL INSULATION LAYER, MANUFACTURING METHOD THEREOF, AND DISPLAY APPARATUS

TECHNICAL FIELD

This disclosure relates to display technology, in particular, to a display panel, a manufacturing method thereof, and a display apparatus.

BACKGROUND

Printed Organic Light Emitting Diodes (Printed OLED) have attracted wide attention especially for large-size display applications due to its high material utilization and high efficiency. The printed OLEDs can be applied to display panels without the need for fine metal mask (FMM) or other complex patterning processes. Furthermore, the printed OLEDs can have full-color display.

BRIEF SUMMARY

One example of the present disclosure is a method of manufacturing a display panel. The method of manufacturing the display panel may include providing a substrate; forming a bank layer on the substrate; forming a thermal insulation layer on the bank layer, forming a modification layer on the thermal insulation layer; forming a main electrode on the modification layer; and forming an auxiliary electrode on the main electrode. In one embodiment, forming the auxiliary electrode on the main electrode may include forming a grid of metal solution on the main electrode; performing a first curing of the grid of metal solution at a first temperature to form a first metal grid; and performing a second curing of the first metal grid at a second temperature by applying a low frequency alternating current to the first metal grid while the substrate is maintained to be at a third temperature lower than the second temperature during the second curing to form the auxiliary electrode. As such, the high temperature region during the formation of the auxiliary electrode will be confined to the main electrode and the auxiliary electrode above the thermal insulation layer without affecting the lower organic light-emitting layer.

Another example of the present disclosure is a display panel. The display panel may include a substrate, a bank layer on the substrate, and a porous thermal insulation layer on the bank layer. The bank layer defines a plurality of pixel areas on the substrate. The porous thermal insulation layer may have a low thermal conductivity of about 0.01 W/mk to about 0.5 W/mK. The new design of the display panel according to some embodiments of the present disclosure utilizes a thermal insulation layer to prc emitting layer from the high temperature used during formation of the auxiliary electrode.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
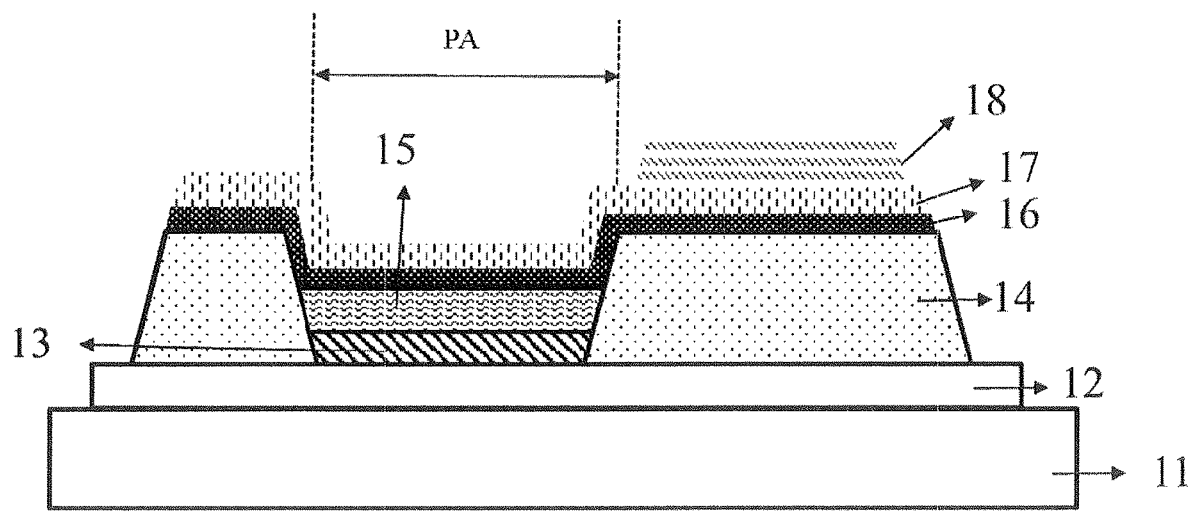
FIG. 1 is a schematic diagram of a method of forming a display panel in the related art.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-6. When referring to the figures, like structures and elements shown throughout are indicated with like reference numerals.

In this specification, the terms "first," "second," etc. may be added as prefixes. These prefixes, however, are only added in order to distinguish the terms and do not have specific meaning such as order and relative merits. In the description disclosure, the meaning of "plural" is two or more unless otherwise specifically defined.

In the description of the specification, references made to the term "some embodiments," "one embodiment," "exemplary embodiments," "example," "specific example," "some examples" and the like are intended to refer that specific features, structures, materials or characteristics described in connection with the embodiment or example are included in at least some embodiments or examples of the present disclosure. The schematic expression of the terms does not necessarily refer to the same embodiment or example. Moreover, the specific features, structures, materials or characteristics described may be included in any suitable manner in any one or more embodiments or examples. A number modified by "about" herein means that the number can vary by 10% thereof.

A top-emitting OLED display apparatus has advantage such as increased aperture ratio and prolonged lifespan. However, since it is difficult to use a thick metal as an upper main electrode in the top-emitting OLED display apparatus, the upper main electrode is usually thin. Accordingly, impedance of the upper main electrode is usually large. Since the OLED display apparatus is a current-driven apparatus, a current flowing through the upper main electrode with high impedance will cause a large voltage drop, which is called IR-Drop.

One solution of overcoming this problem is to form an auxiliary electrode such as a metal grid or metal wires on the upper main electrode to assist the main electrode in conducting electricity. The auxiliary electrode is usually formed by a solution process such as an inkjet printing method. However, in the solution process, the metal solution needs to be heat-cured at a high temperature, for example, above 130° C. for most materials suitable for mass production.

Such high curing temperature can easily damage or negatively affect performance of the underlying organic light-emitting layer.

FIG. 1 shows a schematic diagram of a method of forming an OLED display panel in the related art. As shown in FIG. 1, the OLED display panel includes a substrate 12 and a bank layer 14 on the substrate 12. The bank layer 14 defines a plurality of pixel areas PA. OLED materials 15 are printed into the pixel area PA by a printing method such as an ink jet printing method, and then dried to form a film in the pixel area. In order to improve electrical injection ability between a main electrode 17 and the printed OLED materials 15, a top-emission printed OLED usually needs to form a modification layer 16 on the printed OLED material 15 and the bank layer 14, for example, by thermal evaporation of the modification layer 16 is usually in a range from about 10 nm to about 20 nm. Finally, a transparent metal oxide such as IZO is sputtered on the modification layer 16 to form the main electrode 17. A thickness of the main electrode 17 is usually in a range from about 70 nm to about 300 nm. Then, an auxiliary electrode 18 including a metal grid or metal wires is formed on the main electrode 17 using a solution process such as an inkjet printing method to aid conduction of the main electrode. The solution process for forming the auxiliary electrode 18 generally adopts principle of silver particle sintering or a reduction reaction, thereby requiring a high temperature to cure and form the conductive metal grid or wires. The materials of the auxiliary electrode 18 currently suitable for mass production generally require a processing temperature of above 130° C. to cure and form the conductive metal grid or wires. To reduce the damage or impact that the high processing temperature on the underlying light-emitting layer, a cooling plate 11 is usually placed under the substrate 12 to cool down the light-emitting layer during the formation of the auxiliary electrode. However, heat generated from the high processing temperature during the formation of the auxiliary electrode can still be easily transferred to the light-emitting layer and accordingly negatively affect the performance of the underlying organic light-emitting layer. Thus, the yield loss of this conventional method is very high.

Figure 2:
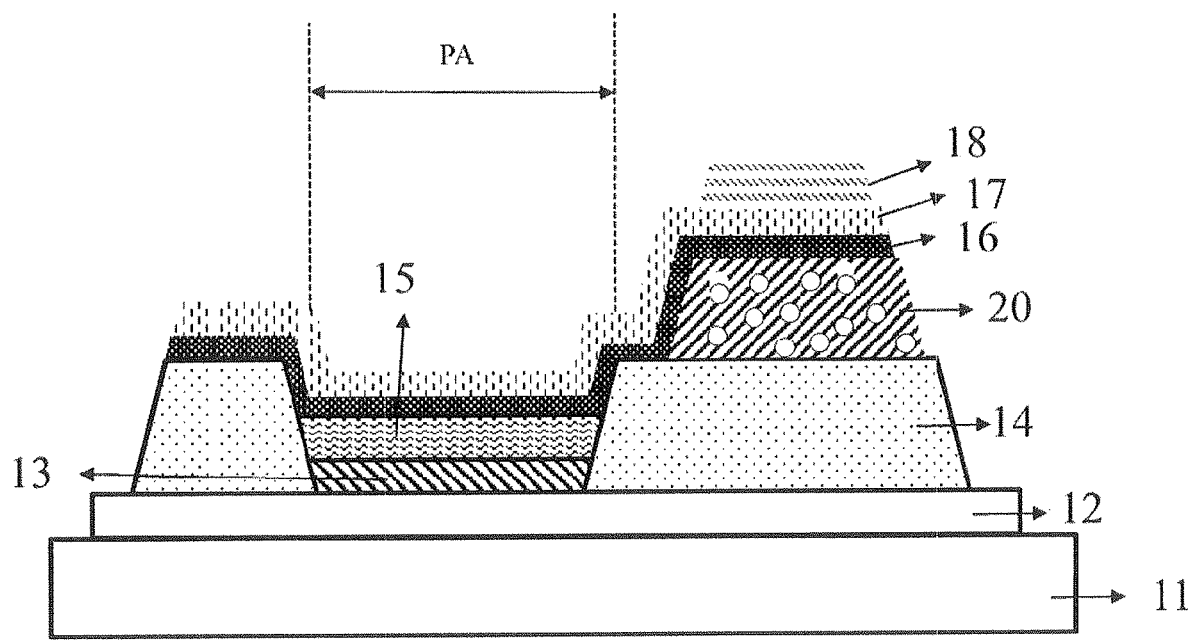
FIG. 2 is a schematic diagram of a display panel according to some embodiments of the present disclosure.

Accordingly, FIG. 2 shows a schematic diagram of an OLED display panel according to some embodiments of the present disclosure. And FIG. 2 is a sectional view along line AA' in FIG. 3. FIG. 4 is a flowchart of a method of forming a display panel according to some embodiments of the present disclosure. As shown in FIG. 2 and FIG. 4, the method of forming the OLED display panel may include providing a substrate 12 (step 11); forming a bank layer 14 on the substrate 12 (step 12); and forming a thermal insulation layer 20 on the bank layer 14 (step 13). The bank layer 14 defines a plurality of pixel areas PA on the substrate 12. The thermal insulation layer 20 has a low thermal conductivity of about 0.001 W/mk to about 1.0 W/mK, preferably of about 0.01 W/mk to about 0.5 W/mK.

As shown in FIG. 2 and FIG. 4, the method of forming the OLED display panel may further include forming a modification layer 16 on the thermal insulation layer 20 (step 14); forming a main electrode 17 on the modification layer 16 (step 15); and forming an auxiliary electrode 18 on the main electrode 17 (step 16). The thermal insulation layer 20 may be a porous thermal insulation layer.

Figure 5:
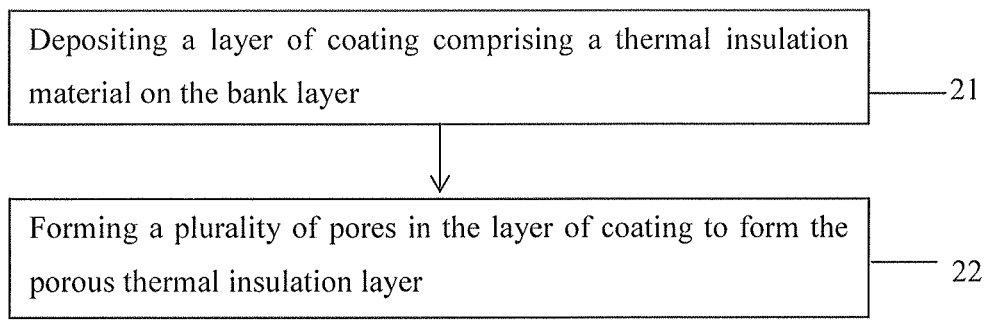
FIG. 5 is a flowchart of a method of forming a thermal insulation layer according to some embodiments of the present disclosure.

FIG. 5 is a flowchart of a method of forming a thermal insulatio: according to some embodiments of the present disclosure. In one embodiment, in step 13, as shown in FIG. 5, forming the porous thermal insulation layer on the bank layer may include depositing a layer of coating comprising a thermal insulation material on the bank layer (step 21) and forming a plurality of pores in the layer of coating to form the porous thermal insulation layer (step 22). In one embodiment, in step 21, a layer of organic resin doped with carbon elements may be coated on the bank layer. Then, in step 22, UV light is used to irradiate the layer of organic resin. The carbon elements in the layer of organic resin may be oxidized by ozone generated by interaction of UV light with oxygen to form carbon dioxide, which escapes from the layer of organic resin to form a plurality of pores in the layer of the organic resin. As a result, a porous thermal insulation layer is formed. The organic resin may be a photoresist. In one embodiment, the thermal insulation layer includes a same photoresist as the bank layer. The layer of organic resin may be doped with organic particles other than the carbon elements as long as the organic particles can be degraded, for example, by UV light to produce volatile species. Those volatile species can form a plurality of pores in the layer of organic resin.

In another embodiment, in step 13, a layer of porous material is directly applied on the bank layer to form the porous thermal insulation layer. The porous material may include, but not limited to, one or more selected from the group consisting of hypercrosslinked porous organic polymers such as Davankov® resins; polymers comprising an aromatic repeating unit having a chloromethyl group; polymers comprising a repeating unit having a benzyl alcohol group; porous cellulose triacetate and derivatives thereof, polyetherimides, and polyimides.

In step 13, the pore size and porosity of the thermal insulation layer can be adjusted by adjusting the composition ratio of the coating layer and the UV irradiation process. The sizes of pores in the porous material layer may be different according to different requirements. In one embodiment, the porosity of the thermal insulation layer is more than 5%, preferably more than 10% to ensure sufficiently low thermal conductivity. The pores may be formed inside the thermal insulation layer and/or on the surface of the thermal insulation layer.

The subsequent steps of fabricating other layers such as the modification layer (step 14) and the main electrode (step 15) may be the same as those in the related art.

In one embodiment, after the common hole injection layer (HIL) and the hole (HTL) are fabricated, the RGB light-emitting layer is printed separately into the pixel areas PA. In one embodiment, the organic light-emitting layer is made by thermal evaporation. Then, the modification layer is fabricated by thermal evaporation. A transparent metal oxide such as indium zinc oxide (IZO) may be fabricated as the main electrode by sputtering to form a full color display panel. The main electrode may also be made of a thin metal electrode such as magnesium, silver, or a magnesium-silver alloy prepared by thermal evaporation. A transparent semi-conductor or a conductor may be optionally coated on the thin metal electrode according to different requirements.

Figure 6:
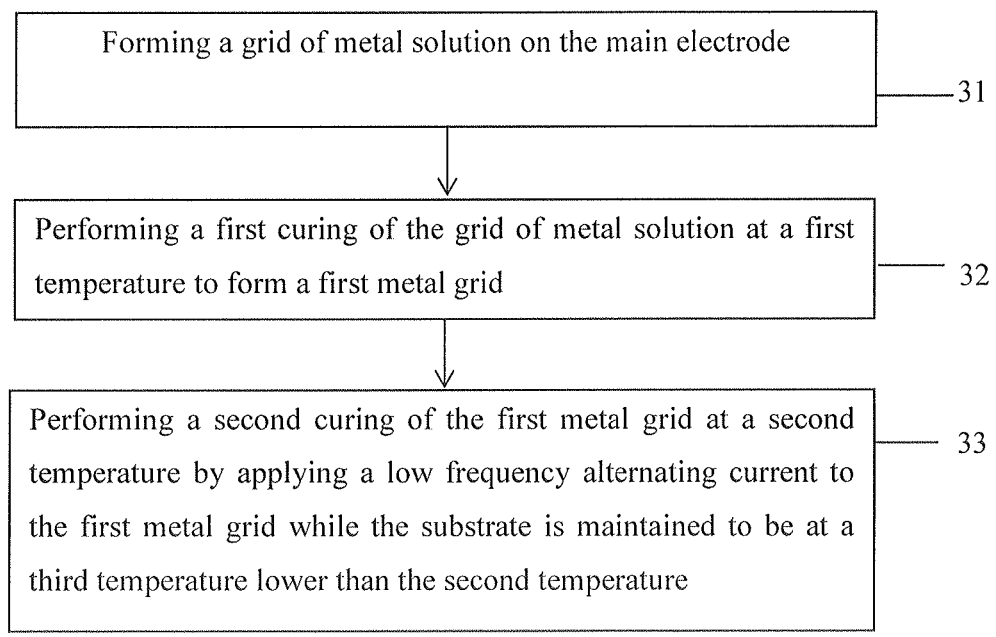
FIG. 6 is a flow chart of a method of forming an auxiliary electrode according to some embodiments of the present disclosure.

Finally, in step 16, an auxiliary electrode is fabricated on the main electrode, for example, by a solution process such as an inkjet printing method. FIG. 6 is a flow chart of a method of forming an auxiliary electrode according to some embodiments of the present disclosure. As shown in FIG. 6, forming the auxiliary electrode on the main electrode comprises forming a grid composed of metal solution on the main electrode (step 31); performing a first curing of the grid composed of metal solution at a first temperature to form a first metal grid (step 32); and performing a second curing of the first metal grid at a second temperature by applying a low frequency alternating current to the first metal grid while the substrate is maintained to be at a third temperature lower than the second temperature during the second curing to form the auxiliary electrode (step 33).

In one embodiment, in step 31, the metal solution contains a metal material such as silver particles or silver nitrate, gold particles or copper particles, or an alloy containing indium, tin, antimony, zinc or other metals. Furthermore, the metal solution may contain organic materials such as diluents, dispersants, curing reactants, and the like. The grid of metal solution may be formed on the main electrode by a printing method such as an inkjet printing method or a transfer printing method. Although the metal solution such as silver ink has flowability, because the droplet volume is small, the viscosity and surface tension of the metal solution enable formation of the grid-like pattern of the metal solution. A lithographic plate, a letterpress or a gravure may be used during the transfer printing.

In one embodiment, in the first curing step 32, the metal solution is pre-cured in the first step to form a first metal grid. The first curing may be performed by using a general heating plate at a first temperature in the range of about 80° C. to about 100° C. At this time, the first metal grid becomes conductive but has a high electrical resin sheet resistance of the first metal grid may be in a range from about 1Ω/□ to 100 Ω/□.

Figure 3:
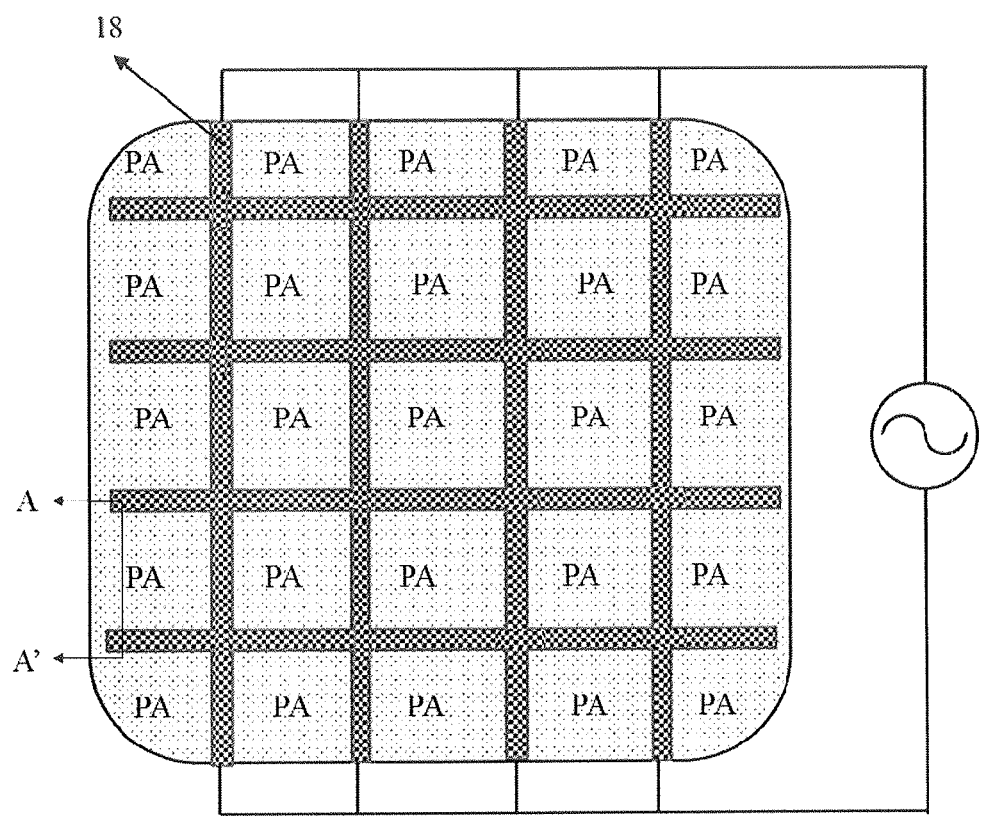
FIG. 3 is a schematic diagram of a top view of the display panel showing a second curing of a first metal grid by applying a low frequency alternating current to form an auxiliary electrode according to some embodiments of the present disclosure.
Figure 4:
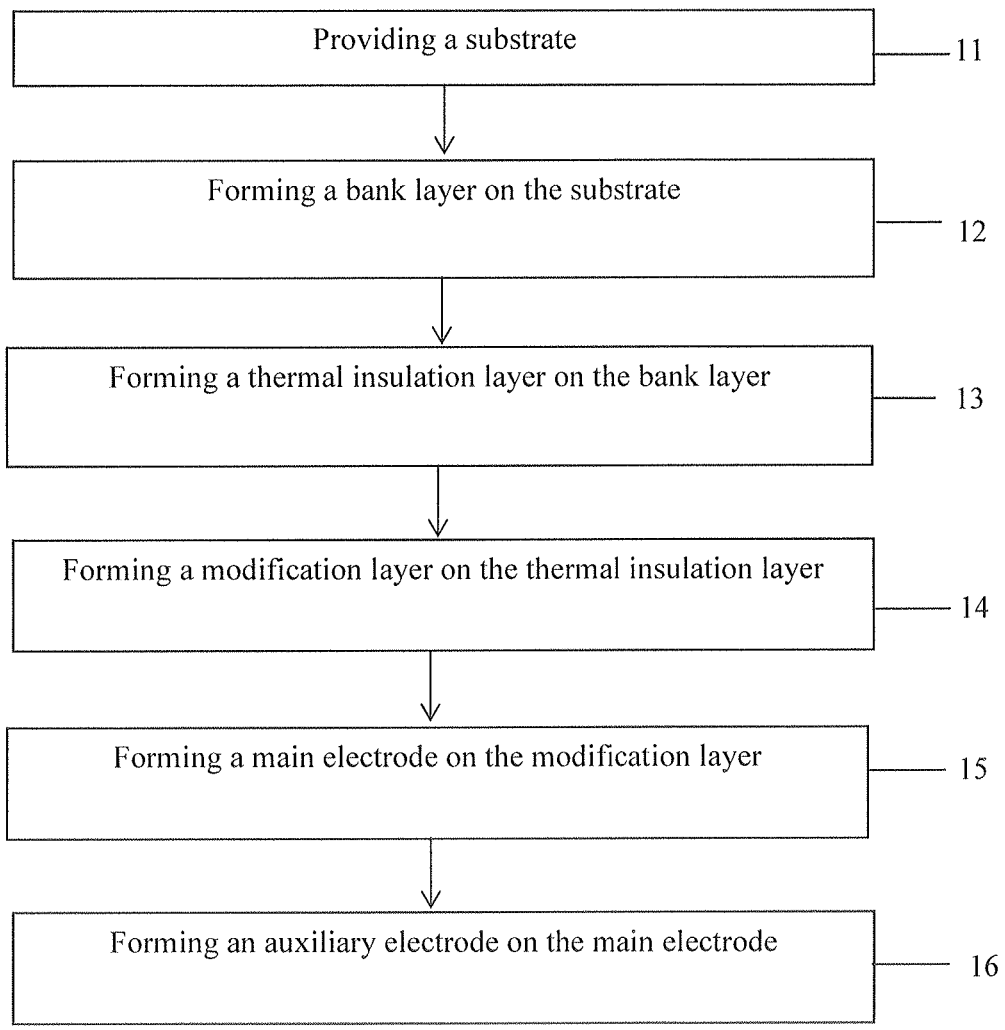
FIG. 4 is a flowchart of a method of forming a display panel according to some embodiments of the present disclosure.

In one embodiment, in the second curing step 33, the substrate is placed on the cooling plate and a low frequency alternating current is applied to the edge of the first metal grid to heat the grid to a second temperature such as about 130° C., as shown in FIG. 3. Due to the poor thermal conductivity of the porous thermal insulation layer, the ohmic heat effect of the alternating current on the first metal grid will create a temperature gradient between the main electrode and the underlying OLED layer. The high temperature region will be confined to the metal grid above the thermal insulation layer without affecting the lower organic light emitting layer. After the second high-temperature curing, the obtained metal grid has a low resistance of smaller than 1Ω/□, and the metal grid with such a low resistance can play the role of the auxiliary electrode.

In one embodiment, in the second curing step 33, the low frequency alternating current may be applied to the first metal grid in a first direction and a second direction respectively according to different requirements. The first direction is different from the second direction. In one embodiment, as shown in FIG. 3, the low frequency alternating current may first be applied to the first metal grid in a row direction, then later in a column direction.

In one embodiment, the second temperature is in a range from about 90° C. to about 170° C. The first temperature is in a range from about 80° C. to about 100° C. The second temperature is higher than the first temperature. The low frequency alternating current has a frequency in a range from about 50 Hz to about 60 Hz. The third temperature is much lower than the second temperature. In one embodiment, the third temperature is about room temperature. In one embodiment, the display panel is a top-emitting OLED display panel.

According to some embodiments of the present disclosure, a thermal insulation layer is utilized to reduce heat transfer between the auxiliary electrode and the light emitting layer. Furthermore, formation of the auxiliary electrode includes two steps of curing processes: a first curing at a relatively low temperature to form a first metal grid and a second curing at a relatively high temperature, for example, by applying a low frequency alternating current to the first metal grid. As such, the light-emitting layer is well protected from the heat generated during the formation of the auxiliary electrode.

Another embodiment of the present disclosure is a display pane FIG. 2, the display panel may include a substrate, a bank layer on the substrate, and a thermal insulation layer on the bank layer. The bank layer defines a plurality of pixel areas PA on the substrate. The thermal insulation layer has a low thermal conductivity of about 0.001 W/mk to about 1.0 W/mK, preferably of about 0.01 W/mk to about 0.5 W/mK. Due to its low thermal conductivity, heat transfer across the thermal insulation layer is very low.

As shown in FIG. 2, the OLED display panel according to some embodiments of the present disclosure may further includes a modification layer on the thermal insulation layer, a main electrode on the modification layer, and an auxiliary electrode on the main electrode.

In one embodiment, the thermal insulation layer is porous to ensure low thermal conductivity of the layer. The thermal insulation layer may have porosity in a range from about 3% to 30%, preferably from about 5% to about 15%, and more preferably from about 8% to 12%. Compared with the conventional structure, the display panel of the present embodiment additionally adds a layer of porous thermal insulation material after the bank layer is fabricated.

In one embodiment, the thermal insulation layer comprises one or more selected from the group consisting of hypercrosslinked porous organic polymers such as Davankov® resins; polymers comprising an aromatic repeating unit having a chloromethyl group; polymers comprising a repeating unit having a benzyl alcohol group; porous cellulose triacetate and derivatives thereof, polyetherimides, and polyimides.

In one embodiment, the bank layer and the thermal insulation layer are made of a same material such as a photoresist. The thermal insulation layer may have a thickness in a range of about 0.1 μm to about 20 μm, preferable about 0.2 μm to about 10 μm.

In one embodiment, the material of modification layer comprises aromatic derivatives based on anthracene, pyrene, fluorene, arylamine, carbazole, sulfone, etc. or other aromatics containing a benzene and a heterocyclic ring such as N, N'-diphenyl-N,N'-(1-naphthyl)-1,1'-biphenyl-4,4'-diamine (NPB); tris(8-hydroyquinoline)aluminum (Alq3); 2,9-dimethyl-4,7-diphenyl-1,10-phnanthroline (BCP), etc. In one embodiment, the modification layer comprises an electron transport layer and/or an electron injection layer.

Materials for forming the transparent main electrode include tra conductive oxides (TCO's), such as indium tin oxide (ITO); thin layers of metal, such as Al, having a thickness on the order of 20 nm; and conductive polymers such as polythiophene.

As shown in FIG. 2, the OLED display panel according to some embodiments of the present disclosure may further include a pixel electrode, an light-emitting layer, the modification layer, and the main electrode sequentially on the substrate in the plurality of pixel areas PA.

FIG. 3 shows a top view of the display panel. In one embodiment, as shown in FIG. 3, the auxiliary electrode may be of a grid structure. In one embodiment, a plurality of auxiliary electrode points on the display panel is connected into one unitary structure to form the grid structure. The auxiliary electrode may also comprise metal wires. Resistance of the auxiliary electrode may be less than 1 Ω/□.

The principle and the embodiment of the disclosure are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the embodiment is not limited to the specific combination of the technical features, and also should covered other embodiments which are formed by combining the technical features or the equivalent features of the technical features without departing from the inventive concept. For example, embodiments may be obtained by replacing the features described above as disclosed in this disclosure (but not limited to) with similar features.

What is claimed is:

1. An organic light emitting diode (OLED) display panel, comprising:
   a substrate;
   a bank layer on the substrate, the bank layer defining a plurality of pixel areas on the substrate; and
   a thermal insulation layer on the bank layer;
   wherein
   the OLED display panel further includes a modification layer on the thermal insulation layer, a main electrode on the modification layer, and an auxiliary electrode on the main electrode.

2. The OLED display panel of claim 1,
   wherein the thermal insulation layer has a thermal conductivity of about 0.01 W/mk to about 0.5 W/mK.

3. The OLED display panel of claim 1, wherein the thermal insulation layer is porous.

4. The OLED display panel of claim 3, wherein the thermal insulation layer has porosity in a range of about 5% to about 15%.

5. The OLED display panel of claim 1, wherein the thermal insulation layer comprises one or more selected from the group consisting of hypercrosslinked porous organic polymers; polymers comprising an aromatic repeating unit having a chloromethyl group; polymers comprising a repeating unit having a benzyl alcohol group; porous cellulose triacetate and derivatives thereof, polyetherimides, and polyimides.

6. The OLED display panel of claim 1, wherein the bank layer and the thermal insulation layer are made of a same material.

7. The OLED display panel of claim 1, wherein the thermal insulation layer has a thickness in a range of about 0.2 μm to about 10 μm.

8. The OLED display panel of claim 1, wherein the auxiliary electrode is of a grid structure.

9. The OLED display panel of claim 1, wherein the modification layer comprises an electron transport layer and/or an electron injection layer.

10. The OLED display panel of claim 1, further comprising a pixel electrode, a light emitting layer, the modification layer, and the main electrode sequentially on the substrate in at least one of the plurality of pixel areas.

11. A method of forming an organic light emitting diode (OLED) display panel, comprising:
    providing a substrate;
    forming a bank layer on the substrate, the bank layer defining a plurality of pixel areas on the substrate; and
    forming a thermal insulation layer on the bank layer;
    wherein
    forming the thermal insulation layer on the bank layer includes:
    coating a layer of porous thermal insulation material on the bank layer to form a porous thermal insulation layer.

12. The method of forming the OLED display panel of claim 11, wherein
    the thermal insulation layer has a thermal conductivity of about 0.01 W/mk to about 0.5 W/mK.

13. The method of forming the OLED display panel of claim 11, wherein forming the thermal insulation layer on the bank layer comprises:
    depositing a layer of organic resin doped with carbon elements on the bank layer; and
    irradiating the layer of organic resin with UV light,
    wherein the carbon elements in the layer of organic resin are oxidized by ozone generated by a interaction of UV light with oxygen to form carbon dioxide, thereby forming a porous thermal insulation layer.

14. The method of forming the OLED display panel of claim 11, further comprising:
    forming a modification layer on the thermal insulation layer;
    forming a main electrode on the modification layer; and
    forming an auxiliary electrode on the main electrode.

15. The method of forming the OLED display panel of claim 14, wherein forming the auxiliary electrode on the main electrode comprises:
    forming a grid composed of metal solution on the main electrode;
    performing a first curing of the grid composed of metal solution at a first temperature to form a first metal grid; and
    performing a second curing of the first metal grid at a second temperature by applying a low frequency alternating current to the first metal grid while the substrate is maintained to be at a third temperature lower than the second temperature during the second curing to form the auxiliary electrode.

16. The method of forming the OLED display panel of claim 15, wherein the low frequency alternating current is applied to the first metal grid in a first direction and a second direction, respectively, during the second curing, the first direction being different from the second direction.

17. The method of forming the OLED display panel of claim 15, wherein the second temperature is in a range from about 90° C. to about 170° C. and the first temperature is in a range from about 80° C. to about 100° C.

18. The method of forming the OLED display panel of claim 15, wherein the low frequency alternating current has a frequency in a range from about 50 Hz to about 60 Hz and the third temperature is about room temperature.

19. The method of forming the OLED display panel of claim 15, wherein the metal solution comprises one or more selected from the group consisting of silver particle, silver nitrate, gold particle, copper particle, or an alloy containing indium, tin, antimony, and/or zinc.

20. The method of forming the OLED display panel of claim 14, wherein resistance of the auxiliary electrode is less than 1Ω/□.

* * * * *